(12) United States Patent
Daizo et al.

(10) Patent No.: US 9,401,320 B2
(45) Date of Patent: Jul. 26, 2016

(54) COMBINED SUBSTRATE (71) Applicant: IBIDEN CO., LTD., Ogaki (JP)

(72) Inventors: Tomoya Daizo, Ogaki (JP); Takema Adachi, Ogaki (JP); Takeshi Furusawa, Ogaki (JP); Wataru Nakamura, Ogaki (JP); Yuki Ito, Ogaki (JP); Yuki Yoshikawa, Ogaki (JP); Tomoyoshi Hirabayashi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 14/638,324

(22) Filed: Mar. 4, 2015

(65) Prior Publication Data
US 2015/0255433 A1 Sep. 10, 2015

(30) Foreign Application Priority Data

Mar. 7, 2014 (JP) .................. 2014-044520

(51) Int. Cl.
*H01L 23/498* (2006.01)
*H01L 25/10* (2006.01)
*H01L 25/00* (2006.01)
*H01L 23/00* (2006.01)

(52) U.S. Cl.
CPC .... *H01L 23/49811* (2013.01); *H01L 23/49827* (2013.01); *H01L 23/49833* (2013.01); *H01L 25/105* (2013.01); *H01L 25/50* (2013.01); *H01L 23/49894* (2013.01); *H01L 24/13* (2013.01); *H01L 24/16* (2013.01); *H01L 24/48* (2013.01); *H01L 2224/131* (2013.01); *H01L 2224/16227* (2013.01); *H01L 2224/48091* (2013.01); *H01L 2224/48227* (2013.01); *H01L 2224/81191* (2013.01); *H01L 2224/81815* (2013.01); *H01L 2225/107* (2013.01); *H01L 2225/1023* (2013.01); *H01L 2225/1058* (2013.01); *H01L 2924/15311* (2013.01); *H01L 2924/15331* (2013.01); *H01L 2924/181* (2013.01)

(58) Field of Classification Search
CPC ............... H01L 25/0657; H01L 24/14; H01L 23/49811; H01L 23/49827; H01L 25/50; H01L 25/105; H01L 23/49833; H01L 24/48; H01L 24/13
See application file for complete search history.

(56) References Cited

U.S. PATENT DOCUMENTS

| 7,382,049 | B2* | 6/2008 | Ho ........................ H01L 21/563 257/737 |
| 8,241,963 | B2* | 8/2012 | Shen ................. H01L 23/49816 257/737 |
| 8,269,345 | B2* | 9/2012 | Patel ....................... H01L 24/11 257/737 |
| 8,318,596 | B2* | 11/2012 | Kuo ....................... H01L 24/11 257/737 |

(Continued)

FOREIGN PATENT DOCUMENTS

KR  100722634  5/2007

*Primary Examiner* — William Coleman
(74) *Attorney, Agent, or Firm* — Oblon, McClelland, Maier & Neustadt, L.L.P.

(57) ABSTRACT

A combined substrate includes a first substrate having multiple first metal posts, a second substrate having multiple second metal posts such that the second metal posts are positioned to oppose the first metal posts, respectively, and multiple solder structures interposed between the first metal posts and the second metal posts, respectively. The first metal posts and/or the second metal posts have recessed surfaces formed such that the solder structures are formed on the recessed surfaces, respectively.

20 Claims, 8 Drawing Sheets

(56) References Cited

U.S. PATENT DOCUMENTS

2012/0012997 A1* 1/2012 Shen ............... H01L 23/49816
257/737

2013/0256873 A1* 10/2013 Zhang ............... H01L 25/105
257/737

2014/0061906 A1* 3/2014 Liao ................. H01L 24/13
257/738

* cited by examiner

COMBINED SUBSTRATE

CROSS-REFERENCE TO RELATED APPLICATIONS

The present application is based upon and claims the benefit of priority to Japanese Patent Application No. 2014-044520, filed Mar. 7, 2014, the entire contents of which are incorporated herein by reference.

BACKGROUND OF THE INVENTION

1. Field of the Invention

The present invention relates to a combined substrate in which a second substrate is superposed on and electrically connected to a first substrate.

2. Description of Background Art

In a combined substrate, a metal post that protrudes from a substrate may be soldered to a solder bump of another substrate (for example, see Korean Patent No. 100722634. The entire contents of this publication are incorporated herein by reference.

SUMMARY OF THE INVENTION

According to one aspect of the present invention, a combined substrate includes a first substrate having multiple first metal posts, a second substrate having multiple second metal posts such that the second metal posts are positioned to oppose the first metal posts, respectively, and multiple solder structures interposed between the first metal posts and the second metal posts, respectively. The first metal posts and/or the second metal posts have recessed surfaces formed such that the solder structures are formed on the recessed surfaces, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

First Embodiment

Figure 1:
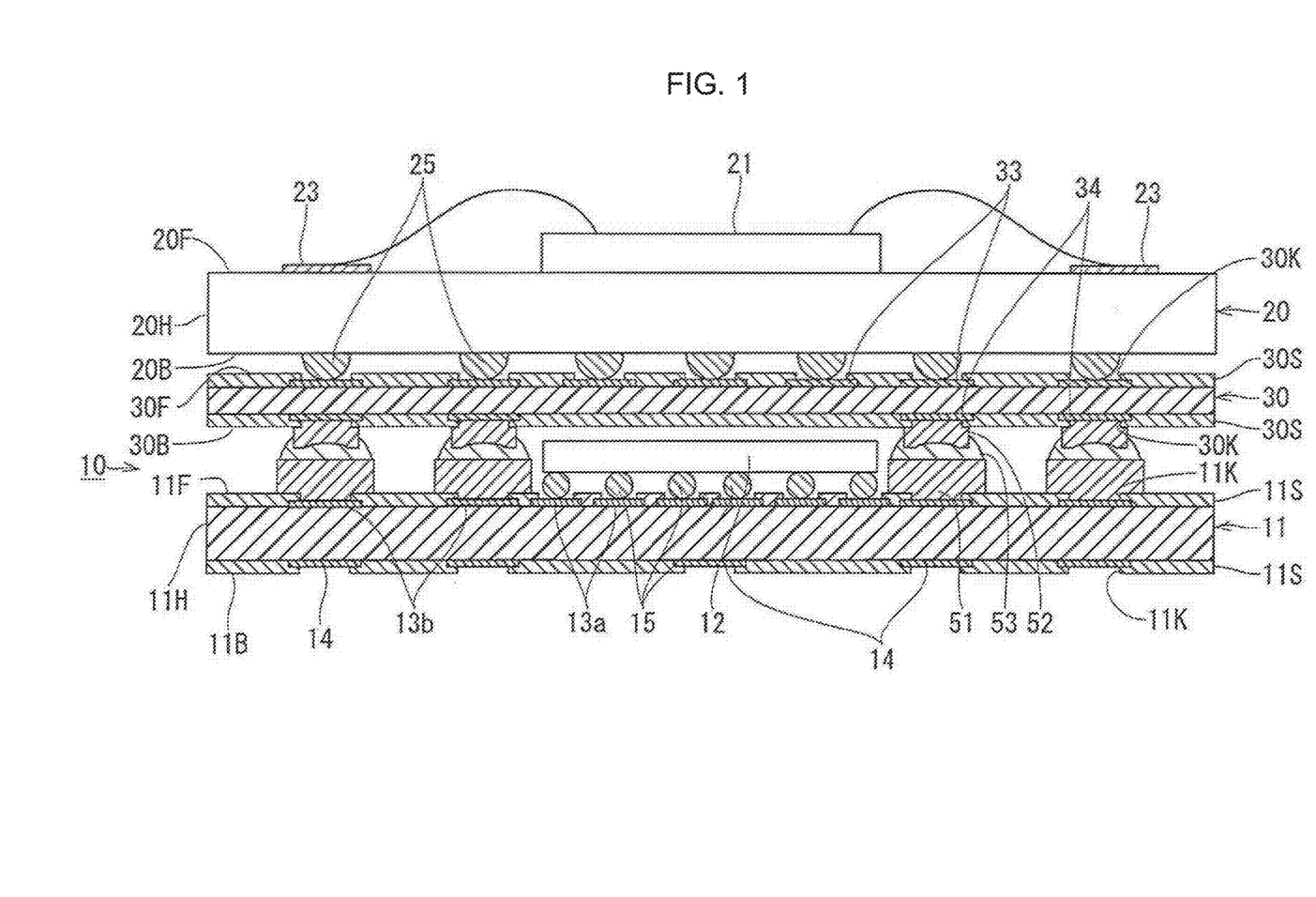
FIG. 1 illustrates a cross-sectional view of a combined substrate according to a first embodiment of the present invention.

In the following, a first embodiment of the present invention is described based on FIG. 1-5. A combined substrate 10 of the present embodiment is formed by superposing a second substrate 30 on a first substrate 11. A so-called PoP structure (package-on-package structure) in which a third substrate 20 is superposed on the combined substrate 10 is illustrated in FIG. 1. In the PoP structure, the second substrate 30 becomes an interposer for connecting the third substrate 20 to the first substrate 11.

Figure 2:
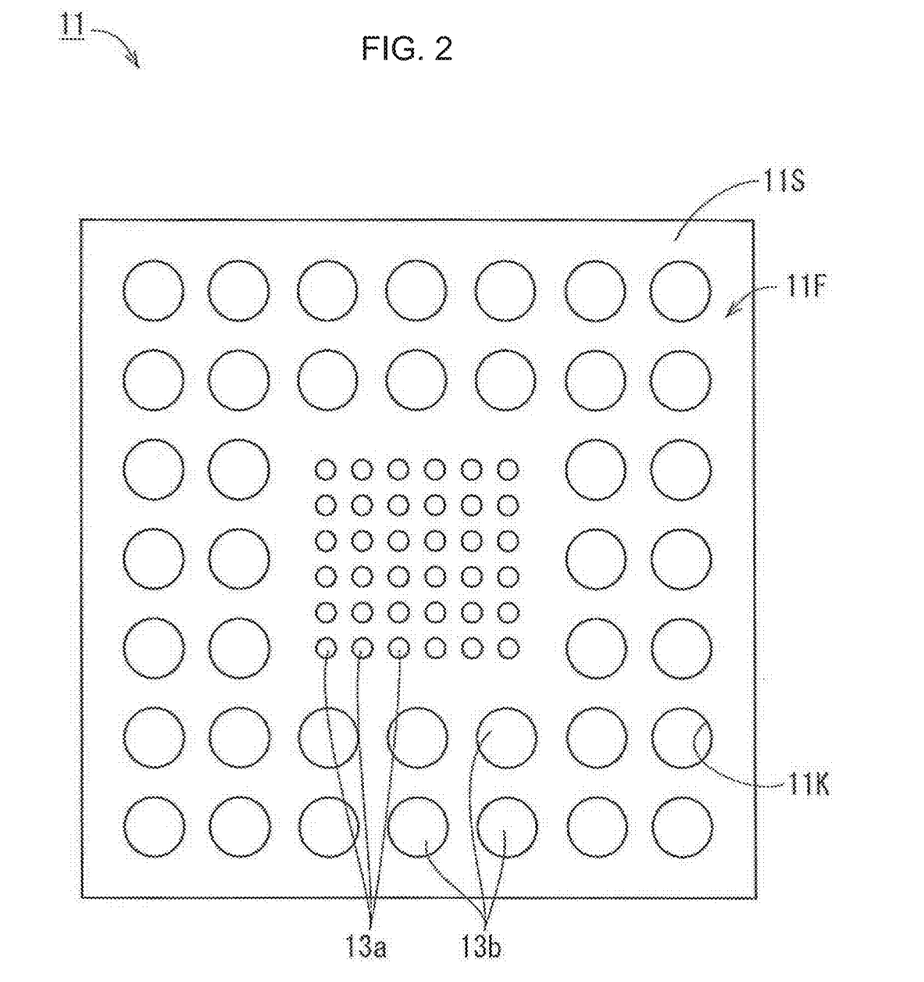
FIG. 2 illustrates a plan view of an F surface of a first substrate.

The first substrate 11 is, for example, a CPU substrate in which a CPU 12 is mounted on a substrate body (11H). The substrate body (11H) forms a multilayer structure with a built-in circuit (not illustrated in the drawings). An F surface (11F), which is a mounting surface, and a B surface (11B), which is a back surface of the substrate body (11H), are covered by solder resist layers (11S, 11S). Further, for example, multiple circular pad openings (11K) are formed in the front and back solder resist layers (11S, 11S). Multiple pads (13a, 13b, 14) connected to the internal circuit of the substrate body (11H) are arranged on deep sides of the pad openings (11K) of the solder resist layers (11S, 11S). A plan view of the F surface (11F) of the first substrate 11 is illustrated in FIG. 2. A group of the pads (13a) for connecting to the above-described CPU 12 is arranged in a matrix shape in a central portion of the F surface (11F). A group of the pads (32b), which are larger than the pads (13a), is arranged in a matrix shape in a frame-shaped region surrounding the pads (13a). The above-described CPU 12 is bump-connected (this is also referred to as a "flip-chip connection") to the group of the pads (13a) by solder balls 15, and first metal posts 51 (to be described in detail later) protrude from the group of the pads (13b). The substrate body (11H) may be a multilayer substrate having a core substrate, for example, as described in Japanese Patent Laid-Open Publication No. 2007-227512, or may be a so-called coreless substrate that does not have a core substrate as described in Japanese Patent Laid-Open Publication No. 2005-236244. The entire contents of Japanese Patent Laid-Open Publication No. 2007-227512 are incorporated herein by reference. Further, the group of the pads 14 of the B surface (11B) of the substrate body (11H) is bump-connected to another substrate (not illustrated in the drawings).

The third substrate 20 is, for example, a memory substrate in which a memory chip 21 is mounted on a substrate body (20H). The substrate body (20H), for example, has a planar shape that is substantially the same as the substrate body (11H) of the first substrate 11. Further, although not illustrated in the drawings, the substrate body (20H) also forms a multilayer structure with a built-in circuit, similar to the substrate body (11H) of the first substrate 11. Multiple pads that are connected to the internal circuit are provided on an F surface (20F) and a B surface (20B). The above-described memory chip 21 is fixed at a center of the F surface (20F) and is wire-bonded to a group of pads 23 surrounding the memory chip 21. Further, solder bumps 25 connected to a group of pads (not illustrated in the drawings) are provided on substantially the entire B surface (20B) of the substrate body (20H).

The second substrate 30, for example, has a planar shape that is substantially the same as the substrate bodies (11H, 20H) of the first substrate 11 and the third substrate 20.

Figure 3:
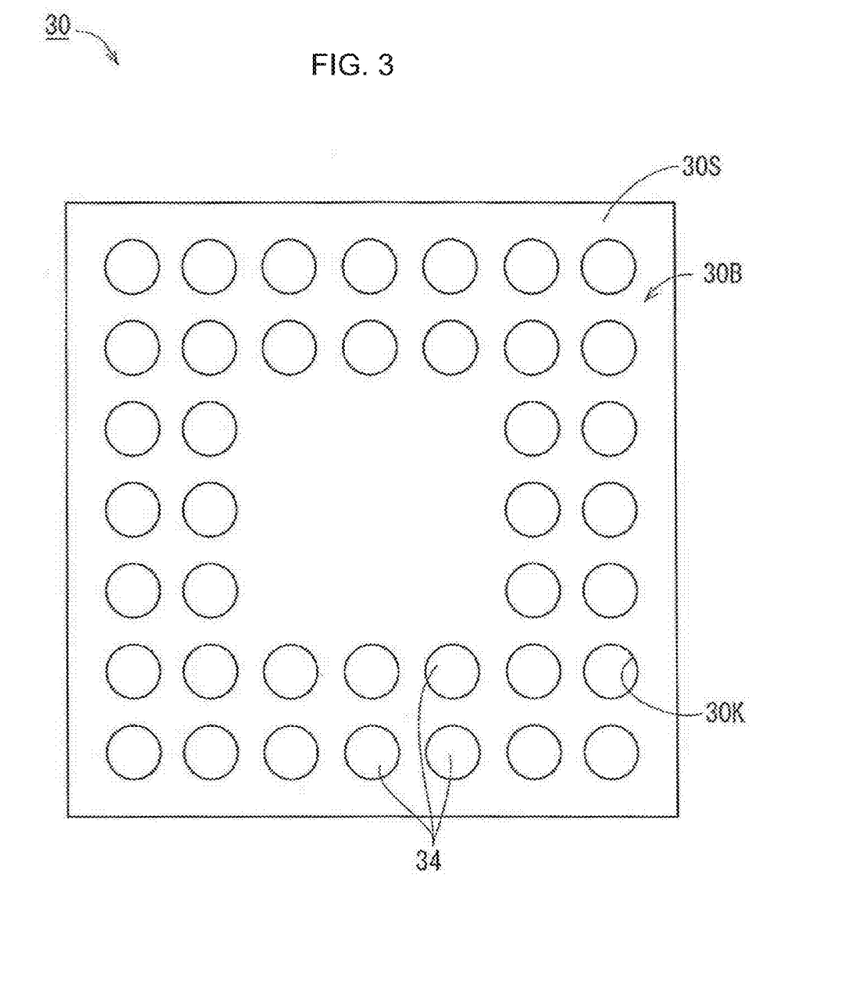
FIG. 3 illustrates a plan view of a B surface of a second substrate.

Similar to the above-described substrate bodies (11H, 20H), the second substrate 30 also forms a multilayer structure with a built-in circuit (not illustrated in the drawings). An F surface (30F) and a B surface (30B) are covered by solder resist layers (30S, 30S). Pads 33, 34 are provided on deep sides of pad openings (30K) of the solder resist layers (30S, 30S). A plan view of the B surface (30B) of the second substrate 30 is illustrated in FIG. 3. The group of the pads 34 is arranged opposing the group of the pads (13b) arranged on the F surface (11F) of the first substrate 11 illustrated in FIG. 2. Further, as compared to the substrate bodies (11H, 20H) in which the CPU 12 or the memory chip 21 is mounted, in the second substrate 30, strength required is low and a circuit structure is also simple. Therefore, the second substrate 30 is thinner than the first substrate 11 and the third substrate 20.

The solder bumps 25 of the third substrate 20 are soldered to the group of the pads 33 of the F surface (30F) of the second substrate 30. On the other hand, multiple second metal posts 52 corresponding to the first metal posts 51 of the first substrate 11 protrude from the group of the pads 34 of the B surface (30B) of the second substrate 30. The group of the second metal posts 52 and the group of the first metal posts 51 are fixed by solders 53 in a state in which the second metal posts 52 and the first metal posts 51 respectively butt against each other.

Figure 5:
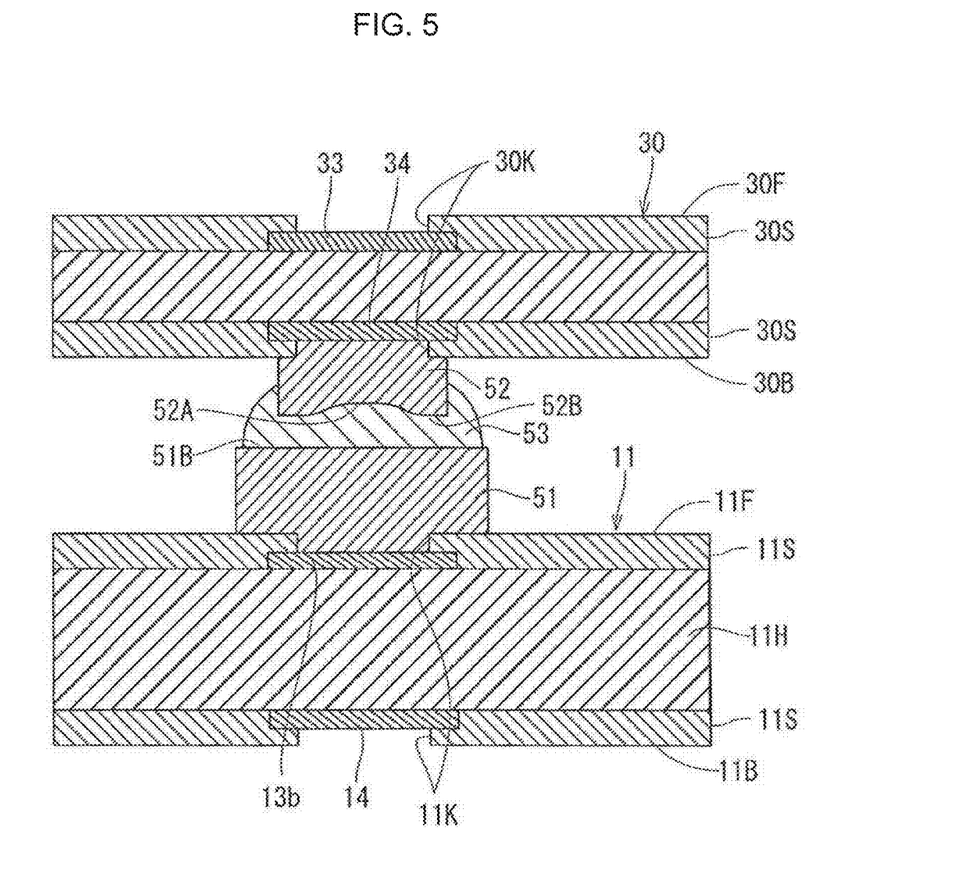
FIG. 5 illustrates a cross-sectional view of a first and a second metal post.

The first and second metal posts (51, 52) are formed, for example, by subjecting the substrate body (11H) of the first substrate 11 and the second substrate 30 to copper plating processing. Specifically, the substrate body (11H) is covered by an insulating film (not illustrated in the drawings). A circular hole is formed in a part of the insulating film to expose the pad (13b) of the substrate body (11H). In this state, the substrate body (11H) is subjected to copper plating processing and thereby the first metal post 51 is formed. As illustrated in FIG. 5, for example, the first metal post 51 forms a columnar shape having an outer diameter larger than that of the circular opening (11K) for the pad (13b) in the solder resist layer (11S), and is in close contact with an opening edge and an inner surface of the pad opening (11K) and the pad (13b) in the pad opening (11K). The second metal post 52 is also similarly formed by plating processing, forms a columnar shape having an outer diameter larger than that of the pad opening (30K) of the solder resist layer (30S), and is in close contact with an opening edge and an inner surface of the pad opening (30K) and the pad 34.

The first metal post 51 is thinner and longer than the second metal post 52. Specifically, the first metal post 51 has an outer diameter of 70-170 μm and a total length of 30-160 μm, and the second metal post 52 has an outer diameter of 70-140 μm and a total length of 15-90 μm. Here, when a pitch (distance between centers) of the pads on which the metal posts are formed is less than 100 μm, the metal posts that can be formed become thin and connection reliability is likely to decrease. When the pitch is larger than 300 μm, a size of the substrate increases, a stress acting on the metal posts increases, and the connection reliability is likely to decrease. Therefore, it is preferable that the pitches between the pads (13b) and between the pads 34 be 100-300 μm. The total length of a metal post means a height from a surface of an uppermost layer (the solder resist layers (11S, 30S)) of the substrate to a highest part of the metal post. Specifically, as in the case of the second metal post 52 illustrated in FIG. 5, where a front-end surface (52B) is a concave surface having a recess (52A), the total length means a height from the surface of the solder resist layer (30S) to an outer edge of the front-end surface (52B). As in the case of the first metal post 51 illustrated in FIG. 5 where a front-end surface (51B) is a flat surface that does not have a recess, the total length means a height from the surface of the solder resist layer (11S) to the front-end surface (51B), which is a flat surface.

The entire front-end surface (51B) of the first metal post 51 is flat, whereas the front-end surface (52B) of the second metal post 52 is in a shape of a concave surface in which the recess (52A) is formed in a part of a flat surface. The recess (52A) is recessed so as to gradually become deeper from the outer edge toward a center part of the front-end surface (52B) of the second metal post 52. More specifically, a maximum depth of the recess (52A) is 5-40 μm.

Figure 4:
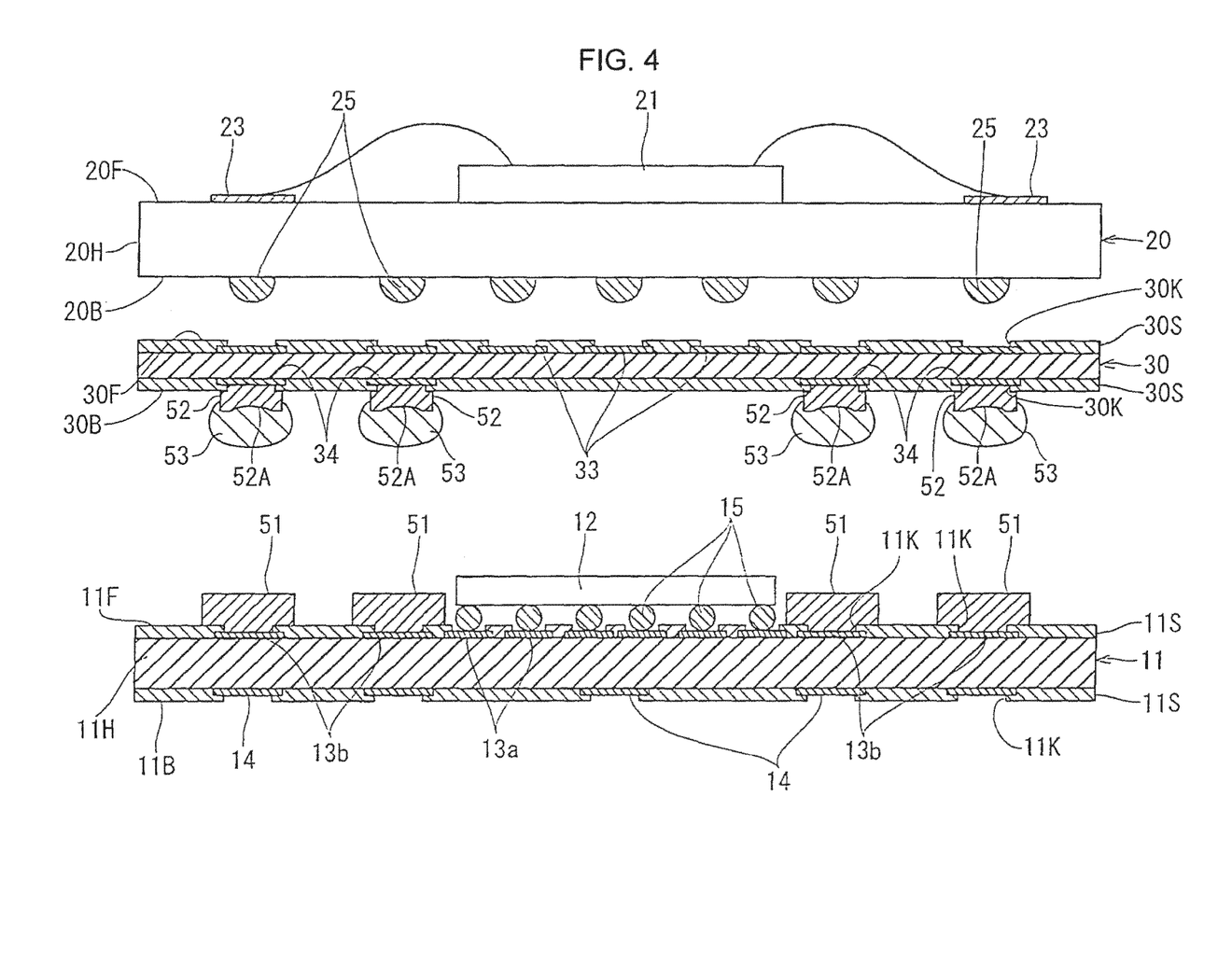
FIG. 4 illustrates an exploded cross-sectional view of the combined substrate.

As illustrated in FIG. 4, for example, the solder 53 that connects the first and second metal posts (51, 52) is initially fixed to the second metal post 52 side in a spherical or ellipsoidal shape. A portion of the solder 53 covers a part of or the entire side surface of the second metal post 52. Further, the solder 53 has a melting point lower than that of the solder ball 15 of the CPU 12 and higher than that of the solder bump 25 of the third substrate 20.

The description about the structure of the combined substrate 10 of the present embodiment is as given above. Next, a method for manufacturing the combined substrate 10 is described. In order to manufacture the combined substrate 10, the third substrate 20 is prepared in advance in which the memory chip 21 is mounted on the F surface (20F) of the substrate body (20H) that is provided with the solder bumps 25. Further, the first substrate 11 is manufactured in which the CPU 12 is mounted on the F surface (11F) of the substrate body (11H). Then, the second substrate 30 is mounted on the first substrate 11.

Specifically, the second substrate 30 is superposed on the F surface (11F) of the first substrate 11, and the solders 53 of the group of the second metal posts 52 and the front-end surfaces (51B) of the group of the first metal posts 51 are put in a state of being in contact with each other. Next, the first substrate 11 and the second substrate 30 are heated at a temperature lower than the melting point of the solder balls 15 of the CPU 12 to reflow the solders 53 and to crush the solders 53 between the front-end surfaces (51B, 52B) of the first and second metal posts (51, 52). Then, the solders 53 are solidified to formed a combined body in which the second substrate 30 is fixed on the first substrate 11. Thereafter, the third substrate 20 is superposed on the second substrate 30 of the combined body and is heated at a temperature lower than the melting point of the solders 53 to reflow the solder bumps 25 of the third substrate 20 and thereby solder the third substrate 20 to the second substrate 30. Thus, the combined substrate 10 is manufactured. It is also possible that, after the first substrate 11 and the second substrate 30 are connected, the third substrate 20 is mounted after mold resin is poured in to fix the CPU 12 and the substrate.

As described above, according to the combined substrate 10 of the present embodiment, the recess (52A) is formed on the front-end surface (52B) of the second metal post 52. Therefore, a contact area between the solder and the metal post is widened and bonding strength of the solder is increased. As a result, reliability of electrical connection between the first substrate 11 and the second substrate 20 is improved. Further, the first and second metal posts (51, 52) are formed by copper plating. Therefore, each of the groups of the metal posts can be easily formed to have a uniform height. In addition, as in the present embodiment, the first and second metal posts (51, 52) are formed by copper plating to have the outer diameters that are respectively larger than the outer diameters of the pad openings (11K, 30K). Therefore, central portions of the front-end surfaces (51B, 52B) of the first and second metal posts (51, 52) can be recessed to form the recesses, sizes of the recesses respectively corresponding to sizes of the pad openings (11K, 30K).

Further, the outer diameter of the first metal post 51 is larger than the outer diameter of the second metal post 52. Therefore, positional displacement of the front-end surface (52B) of the second metal post 52 can be allowed within the front-end surface (51B) of the first metal post 51. This facilitates the operation to make the first and second metal posts (51, 52) to butt against each other. In addition, as described above, the first substrate 11 is thicker than the second substrate 30 and thus is unlikely to thermally deform. In the present embodiment, as described above, the first metal post 51 of the first substrate 11 that is unlikely to thermally deform is formed longer. Therefore, when the first substrate 11 and the second substrate 30 are heated to be soldered, relative positional displacement between the front-end surfaces (51B, 52B) of the first and second metal posts (51, 52) can be suppressed.

Second Embodiment

Figure 6:
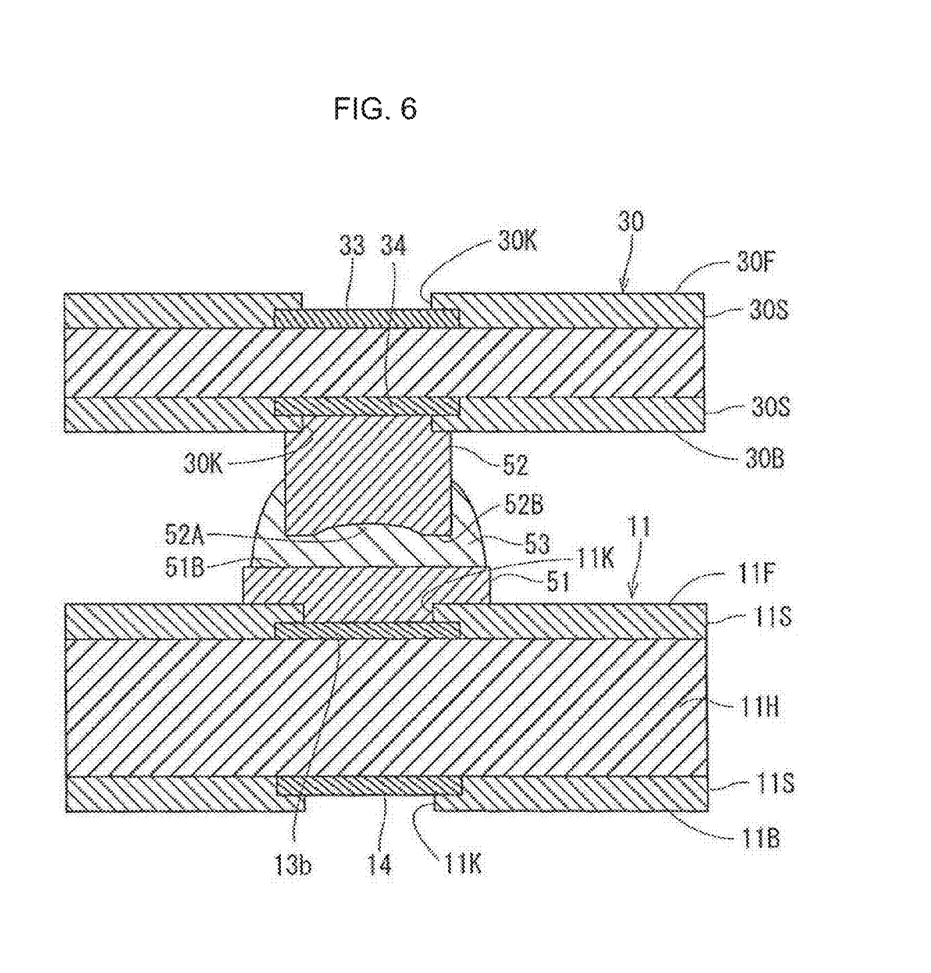
FIG. 6 illustrates a cross-sectional view of a first and a second metal post of a second embodiment.

FIG. 6 illustrates first and second metal posts (51, 52) provided in a combined substrate of a second embodiment. In the present embodiment, the second metal post 52 of the second substrate 30 is longer than the first metal post 51 of the first substrate 11. By making the second metal post 52 longer, which is the thinner one of the first and second metal posts (51, 52), the second metal post 52 can be easily bent and thus an internal stress due to thermal deformation of the first substrate 11 and the second substrate 30 can be relaxed.

Third Embodiment

Figure 7:
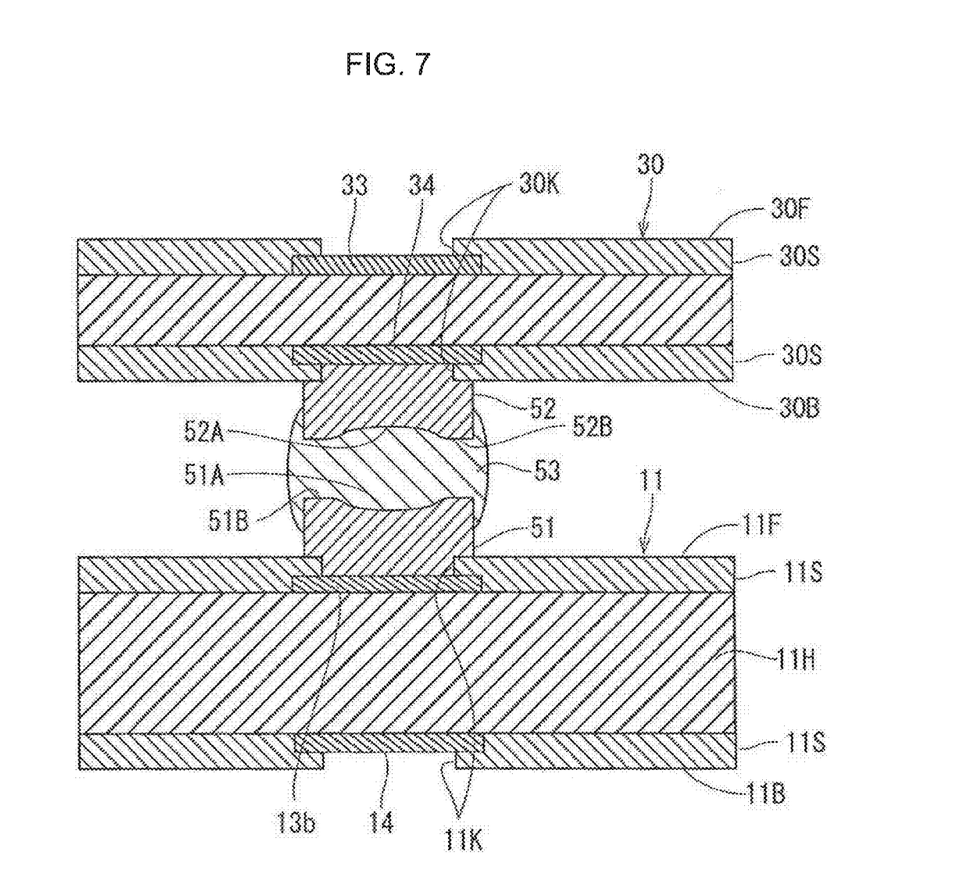
FIG. 7 illustrates a cross-sectional view of a first and a second metal post of a third embodiment.

FIG. 7 illustrates first and second metal posts (51, 52) provided in a combined substrate of a third embodiment. The first and second metal posts (51, 52) are formed to have the same diameter and length, and recesses (51A, 52A) are respectively formed on front-end surfaces (51B, 52B) of the first and second metal posts (51, 52). As a result, bonding strength between solder and the surfaces of the first and second metal posts on which the recesses are formed is increased and reliability of electrical connection between the first substrate 11 and the second substrate 30 is improved.

Example

Figure 8:
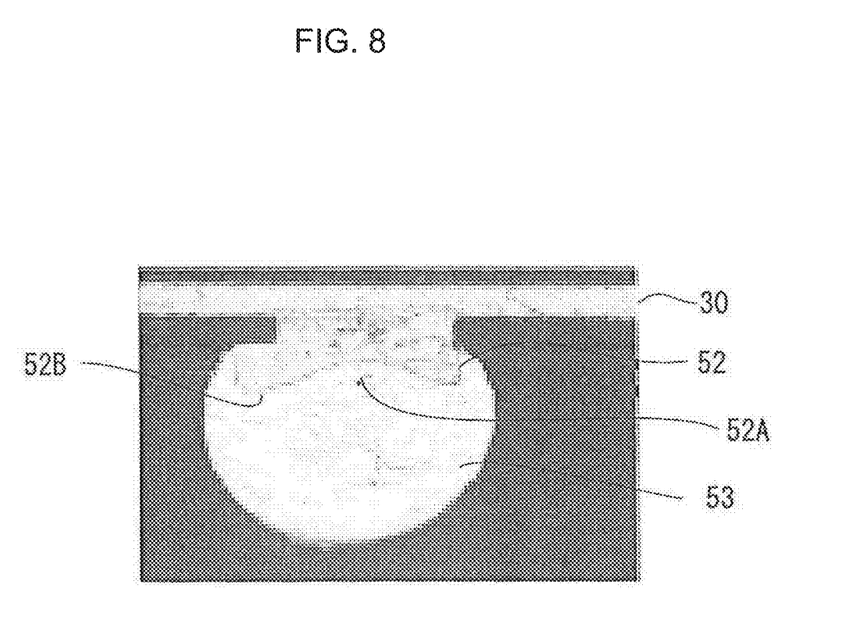
FIG. 8 illustrates a cross-sectional photograph of a metal post.

FIG. 8 illustrates a photograph of an actual second metal post 52 that was formed by subjecting the second substrate 30 to copper plating processing as described above in the first embodiment. As illustrated in FIG. 8, the recess (52A) is formed in the front-end surface (52B) of the second metal post 52.

Other Embodiments

The present invention is not limited to the above-described embodiments. For example, the embodiments described below are also included in the technical scope of the present invention. Further, in addition to the embodiments described below, the present invention can also be embodied in various modified forms within the scope without departing from the spirit of the present invention.

(1) In the first embodiment, after the second substrate 30 is mounted on the first substrate 11, the third substrate 20 is mounted on the second substrate 30. However, it is also possible that, after the third substrate 20 is mounted on the second substrate 30, the second substrate 30 is mounted on first substrate 11.

(2) In the first and second embodiments, an example is described in which the recess (52A) is formed only on the second metal post 52, which is the thinner one of the first and second metal posts (51, 52) that have different lengths and diameters. However, it is also possible that a recess is provided on the first metal post 51, which is the thicker one of the first and second metal posts (51, 52), or a recess is provided on each of both the first and second metal posts (51, 52) that have different diameters.

In a combined substrate which has metal posts protruding from one substrate and soldered to solder bumps of another substrate, there is a conceivable problem that an internal stress occurs between the metal posts and the solder bumps due to thermal deformation of the substrates and thus reliability of electrical connection between the substrates decreases.

A combined substrate according to an embodiment of present invention has high reliability of electrical connection between substrates.

A combined substrate according to an embodiment of the present invention includes a first substrate that has a first metal post; a second substrate that has a second metal post that is formed at a position opposing the first metal post; and a solder that is sandwiched between the first metal post and the second metal post. A recess is formed on one of or each of surfaces of the first metal post and the second metal post, the solder being placed on the surfaces.

Obviously, numerous modifications and variations of the present invention are possible in light of the above teachings. It is therefore to be understood that within the scope of the appended claims, the invention may be practiced otherwise than as specifically described herein.

What is claimed is:

1. A combined substrate, comprising:
a first substrate having a plurality of first metal posts;
a second substrate having a plurality of second metal posts such that the plurality of second metal posts is positioned to oppose the plurality of first metal posts, respectively;
a plurality of solder structures interposed between the plurality of first metal posts and the plurality of second metal posts, respectively; and
a CPU device positioned in a space formed between the first substrate and the second substrate,
wherein at least one of the plurality of first metal posts and the plurality of second metal posts has a plurality of recessed surfaces configured such that the plurality of solder structures is formed on the plurality of recessed surfaces, respectively, the first substrate has a plurality of pads and a plurality of solder balls positioned such that the ads and solder balls are mounting the CPU device on the first substrate, and the plurality of solder structures has a melting point which is lower than a melting point of the plurality of solder balls.

2. A combined substrate according to claim 1, wherein the plurality of first metal posts and the plurality of second metal posts have the plurality of recessed surfaces.

3. A combined substrate according to claim 1, wherein each of the first metal posts and the second metal posts comprises a metal post comprising copper plating material.

4. A combined substrate according to claim 1, wherein each of the first metal posts has a diameter which is greater than a diameter of each of the second metal posts.

5. A combined substrate according to claim 1, wherein each of the first metal posts has an axial length which is different from an axial length of each of the second metal posts.

6. A combined substrate according to claim 1, wherein one of the plurality of first metal posts and the plurality of second metal posts is a plurality of metal posts which is formed thinner and longer than the other one of the plurality of first metal posts and the plurality of second metal posts.

7. A combined substrate according to claim 1, wherein each of the first metal posts has an axial length which is greater than an axial length of each of the second metal posts.

8. A package-on-package structure, comprising:
the combined substrate of claim 1;
a plurality of solder bumps formed on the second substrate; and
a third substrate mounted on the second substrate via the plurality of solder bumps, wherein the melting point of the plurality of solder structures is higher than a melting point of the plurality of solder bumps.

9. A combined substrate according to claim 2, wherein each of the first metal posts and the second metal posts comprises a metal post comprising copper plating material.

10. A combined substrate according to claim 2, wherein each of the first metal posts has a diameter which is greater than a diameter of each of the second metal posts.

11. A combined substrate according to claim 2, wherein each of the first metal posts has an axial length which is different from an axial length of each of the second metal posts.

12. A combined substrate according to claim 2, wherein one of the plurality of first metal posts and the plurality of second metal posts is a plurality of metal posts which is formed thinner and longer than the other one of the plurality of first metal posts and the plurality of second metal posts.

13. A combined substrate according to claim 2, wherein each of the first metal posts has an axial length which is greater than an axial length of each of the second metal posts.

14. A combined substrate according to claim 3, each of the first metal posts has a diameter which is greater than a diameter of each of the second metal posts.

15. A combined substrate according to claim 3, wherein each of the first metal posts has an axial length which is different from an axial length of each of the second metal posts.

16. A combined substrate according to claim 3, wherein one of the plurality of first metal posts and the plurality of second metal posts is a plurality of metal posts which is formed thinner and longer than the other one of the plurality of first metal posts and the plurality of second metal posts.

17. A combined substrate according to claim 3, wherein each of the first metal posts has an axial length which is greater than an axial length of each of the second metal posts.

18. A combined substrate according to claim 4, wherein each of the first metal posts has an axial length which is different from an axial length of each of the second metal posts.

19. A combined substrate according to claim 4, wherein one of the plurality of first metal posts and the plurality of second metal posts is a plurality of metal posts which is formed thinner and longer than the other one of the plurality of first metal posts and the plurality of second metal posts.

20. A combined substrate according to claim 4, wherein each of the first metal posts has an axial length which is greater than an axial length of each of the second metal posts.

* * * * *